(12) United States Patent
Renner et al.

(10) Patent No.: US 6,317,161 B1
(45) Date of Patent: Nov. 13, 2001

(54) HORIZONTAL PHASE-LOCKED LOOP FOR VIDEO DECODER

(75) Inventors: Karl Renner, Dallas; Weider P. Chang, Hurst, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/218,835

(22) Filed: Dec. 22, 1998

Related U.S. Application Data (60) Provisional application No. 60/054,297, filed on Jul. 31, 1997, and provisional application No. 60/068,691, filed on Dec. 23, 1997.

(51) Int. Cl.[7] ............................................... H03L 7/00
(52) U.S. Cl. ..................... 348/536; 348/537; 375/375; 375/376; 327/147
(58) Field of Search ................................ 348/536, 537, 348/539, 516; 327/147, 150, 151, 156, 159, 160; 345/435, 436; 375/375, 376

(56) References Cited

U.S. PATENT DOCUMENTS

| | | | |
|---|---|---|---|
| 4,633,298 | * 12/1986 | Steckler et al. ..................... | 348/539 |
| 5,319,680 | * 6/1994 | Port et al. ............................. | 375/375 |
| 5,486,867 | * 1/1996 | Hsu et al. ............................. | 348/516 |
| 5,677,743 | * 10/1997 | Terao et al. .......................... | 348/536 |
| 5,777,686 | * 7/1998 | Jennes et al. ........................ | 348/537 |
| 5,805,233 | * 9/1998 | West .................................... | 348/537 |
| 5,815,214 | * 9/1998 | Inoue ................................... | 348/536 |
| 5,825,431 | * 10/1998 | Walker ................................. | 348/536 |
| 6,067,092 | * 5/2000 | Rinaldi et al. ....................... | 345/435 |
| 6,100,935 | * 9/1998 | Inoue ................................... | 348/536 |

* cited by examiner

*Primary Examiner*—Reinhard J. Eisenzopf
*Assistant Examiner*—Trang U. Tran
(74) *Attorney, Agent, or Firm*—Alan K. Stewart; Wade James Brady, III; Frederick J. Telecky, Jr.

(57) ABSTRACT

A phase-locked loop is provided which is operable to lock the sampling clock (pixel clock) to the incoming horizontal sync pulse contained within composite video information. Two modes of operation, coarse lock mode and fine lock mode, are used in controlling the phase-locked loop. In the coarse lock mode, coarse corrections are made to a horizontal discrete time oscillator so that a fast lock may be achieve using the fine lock mode. Coarse corrections are based on a normalized sum of weighted pixels collected within a narrow gate window. Lock is achieved when the falling edge is centered within the window.

12 Claims, 7 Drawing Sheets

HORIZONTAL PHASE-LOCKED LOOP FOR VIDEO DECODER

This application claims priority under 35 USC §119(e)(1) of provisional application numbers 60/054,297 filed Jul. 31, 1997 and 60/068,691 filed Dec. 23, 1997.

BACKGROUND OF THE INVENTION

Conventional horizontal phase-locked loops for video decoders serve the purpose of locking the sampling clock, for clocking digital pixel information into the phase-locked loop, to the falling edge of the incoming horizontal sync of composite video information. This lock is required to generate a stable picture in the horizontal direction and position signals which identify the sync tip, back porch, and the color burst of the composite video. The analog video information enters an analog-to-digital converter which outputs digital pixel information. A pixel counter counts video information corresponding to pixels in what can be considered a horizontal scan line across a display monitor screen such as a cathode ray tube. The pixel counter starts with a count of zero and counts to a terminal count and then falls back to zero. The phase-locked loop employs two modes of lock; a coarse lock and a fine lock. In the coarse lock mode the incoming horizontal sync pulse which is usually present during the blanking interval of each line associated with the video signal (for the purpose of being able to synchronize the scanning of the monitor with the scanning of the original image), is detected by an analog circuit. Based on the decode of the pixel counter, a coarse gate filter window (meaning a relatively wide time window in comparison with the narrow time window associated with the fine window discussed below) is enabled around the time the horizontal sync pulse is expected. If the sync does not occur within the gate window for a time corresponding to several consecutive video lines, then either the pixel counter is reset or a correction is made to the clock frequency of the video decoder system in order to move the window to the sync pulse. When the sync pulse falls within the fine lock window, then the fine lock mode is enabled. A fine gate filter window is employed by the fine lock mode which enables a phase detector which calculates a phase error based upon the position of the edge of the sync pulse within a narrow window known as the fine window. This phase error is then filtered by a loop filter whose output is fed to a discrete time oscillator which adjusts the clock frequency to move the sync pulse so that its edge is centered in the fine window, thereby minimizing the phase error. Prior art horizontal phase-locked loop schemes are generally implemented according to analog hardware, digital hardware or a combination of analog and digital hardware. A major drawback of this type of implementation lies in the inconvenience of changing parameters to adapt to a particular video scheme, e.g. NTSC, PAL, NPAL, MPAL, etc. A microprocessor based system is needed in order provide a highly adaptable and improved horizontal phase-locked loop.

BRIEF DESCRIPTION OF THE DRAWINGS

Reference numerals in the drawings have been carried forward.

DETAILED DESCRIPTION OF THE INVENTION

Figure 1:
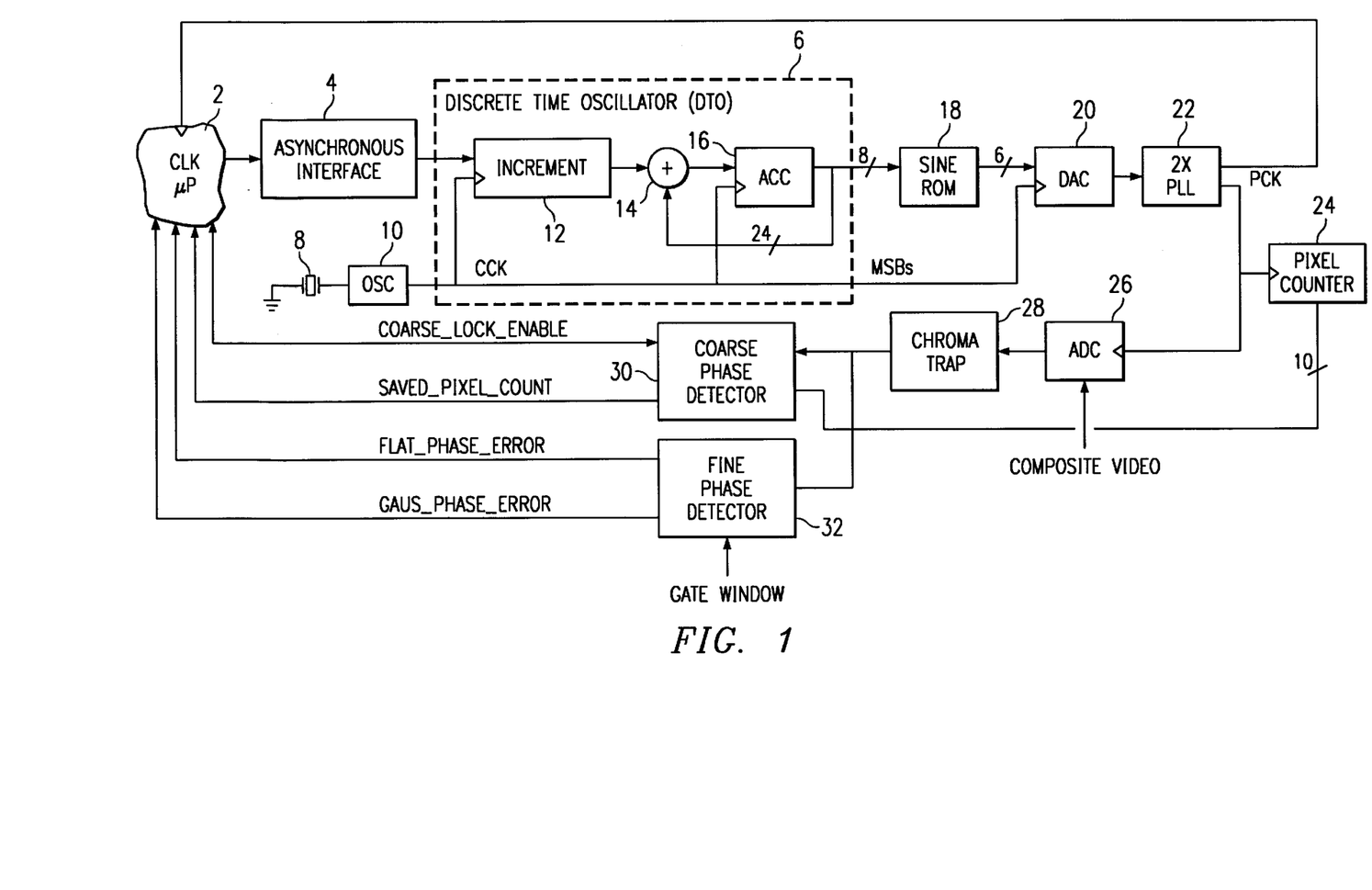
FIG. 1 illustrates a block diagram of the system incorporating the invention's phase-locked loop.

The invention provides a system which locks the phase of the pixel clock pulse to the phase of the horizontal sync pulse. In a preferred embodiment, the invention is implemented on an integrated circuit as part of a video decoder integrated circuit chip. FIG. 1 illustrates a block diagram of the system incorporating the invention's phase-locked loop. On a video line by video line basis, microprocessor 2 reads parameters from the coarse and fine lock phase detectors which generate a phase error based on the position of the horizontal sync pulse relative to the locked position. Discrete time oscillator (DTO) 6 is clocked using a crystal 8 (made preferably of quartz or other suitable material) in conjunction with oscillator 10. DTO 6 is incremented by block 12 which outputs a number to a summer 14 which sums the incremented number with the output of accumulator 16. A limit is placed on the increment number from block 12 so as to limit the clock frequency to microprocessor 2. This limit ensures that the microprocessor throughput is not stressed. Accumulator 16 maintains the count of DTO 6 on an 24 bit parallel basis as a result of this feedback configuration. The value in accumulator 16 is incremented until an upper limit or modulus is reached. This modulus is determined by the number of register bits in the accumulator which is $2^n$. DTO 6's maximum output frequency is restricted to about less than half of oscillator 10's clock frequency so that the digital-to-analog converter 20, which performs digital-to-analog conversions at the clock rate of oscillator 10, will not have to convert a digital input with a frequency of greater than half the clock sampling rate. This is consistent with the Nyquist criterion and it ensures that at least two samples per output period are generated according to the Nyquist criterion. The 8 most significant bit values (MSBs) from the DTO are received by sine ROM (read only memory) 18 and are converted to digital values corresponding to points on a sinusoidal wave, such as sine wave, via a look-up table stored in sine ROM 18. The sine wave values from the 6-bit output of sine ROM 18 are input to DAC 20. The analog signal from DAC 20 is input to analog phase-locked loop (2×PLL) 22. This conversion from the DTO sawtooth waveform to a sine wave provides a waveform which is easier to lock on to for analog phase-locked loop 22 than would be the case without the conversion since the converted sine wave has less frequency content than the square wave. As shown, loop 22 also provides the system clock to microprocessor 2.

Figure 2:
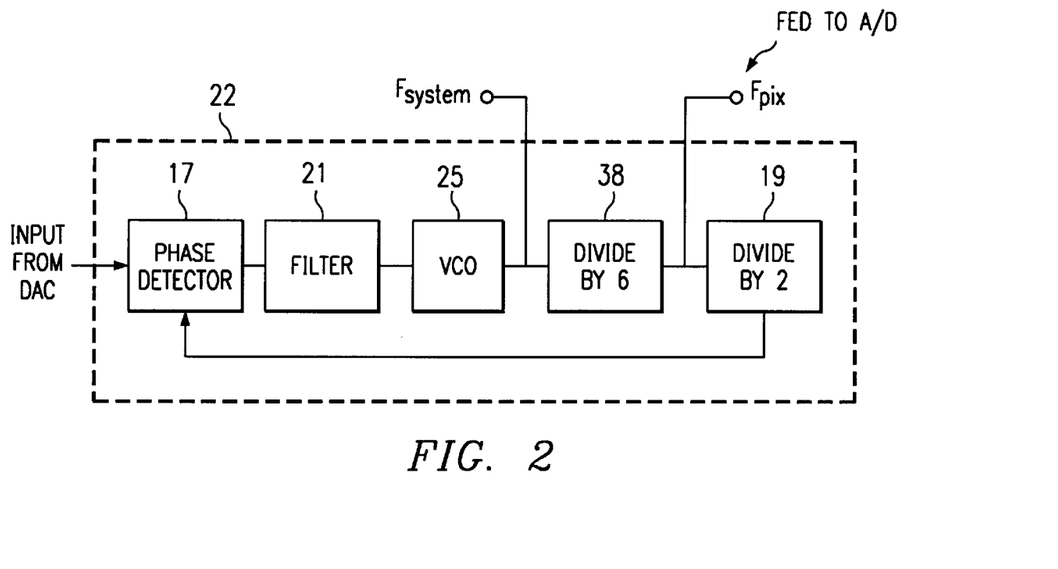
FIG. 2 is a block diagram which illustrates analog phase-locked loop.

FIG. 2 is a block diagram which illustrates analog phase-locked loop 22. The analog input signal from DAC 20 is received by phase detector 17 which also receives a signal from divide by 2 frequency divider 19. This phase detector is preferably of the phase-frequency variety. A phase-frequency detector acts as a phase detector during lock and provides a frequency-sensitive signal to aid acquisition when the loop is out of lock. Filter 21 is a low-pass filter (e.g. RC filter) which is connected to the output of phase detector 17. Filter 21 keeps voltage-controlled oscillator (VCO) 25 from reacting too quickly by eliminating higher frequency inputs such as upper harmonics to VCO 25. VCO 25 outputs a signal which is digitized by analog-to-digital (A/D) converter 36 to serve as the system clock for microprocessor 2 of FIG. 1. Converter 36 can be a simple comparator which outputs a digital signal in response to the input to A/D converter 36 being above or below a certain level. The system clock operates at a frequency $f_{system}$. The output of VCO 25 is received by divide-by-six frequency divider 38. The signal from divider 38 serves as pixel clock PCK which operates at a frequency of $f_{pix}$. Generally, VCO 25 operates at roughly twelve times the frequency of the input signal to phase detector 17 once lock has been substantially achieved. Divide-by-two frequency divider 19 sends a signal back to phase detector 17 so that phase detector 17 can compare the phase of the input signal from DAC 20 of FIG. 1 with the phase of the signal from divider 19 for the purpose of sending a controlling output signal to VCO 25 in an effort to achieve lock. Analog phase-locked loop 22, with its 2× frequency multiplication, minimizes stressing (exceeding the maximum speed of the DTO) the system by reducing the speed at which DTO 6 of FIG. 1 must output data by about one-half than it would otherwise output at oscillator 10's frequency (oscillator 10 is shown in FIG. 1). The number of samples of DTO output data per period for analog phase-locked loop 22 is determined by the equation below.

$$2*\text{crystal clock frequency/pixel clock frequency} = \text{\# of samples/period} \tag{1}$$

For an NTSC clock frequency of 26.8 MHz, 4.36 samples are provided per period by the output of divider 38 in analog phase-locked loop 22.

Figure 3:
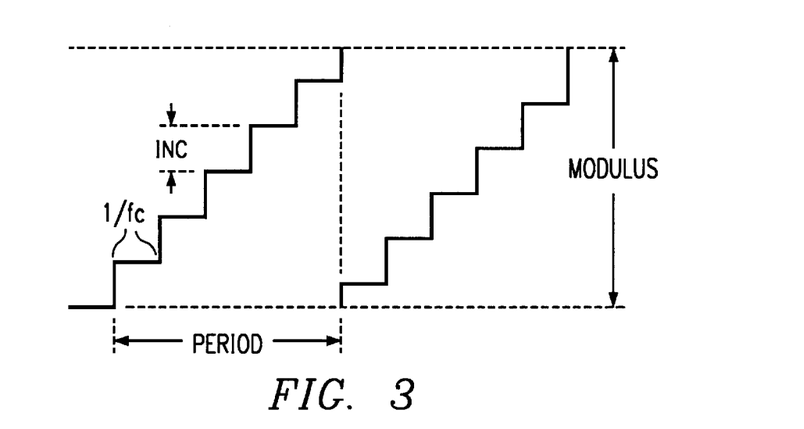
FIG. 3 illustrates a waveform corresponding to the output of the DTO.

Pixel clock PCK clocks both pixel counter 24 and analog-to-digital converter (ADC) 26 of FIG. 1. By definition, a pixel clock is used to quantize analog video information into pixels for each horizontal line of video information. A higher pixel clock frequency corresponds to the production of more pixels per horizontal line of video information. FIG. 3 illustrates a waveform corresponding to the output of DTO 6. DTO 6's 8 most significant bit (MSB) output to sine ROM 18 resembles a sawtooth wave form with stairsteps, as shown on the left-hand side of FIG. 3, with each stairstep equal to the increment (inc.) shown. The duration of each step is equal to the period of clock 8 of FIG. 1, $1/f_c$, where $f_c$ is the frequency of clock 8. Increments inc in FIG. 3 correspond to the increments generated by block 12 of FIG. 1. The number of stairsteps, x, multiplied by increment inc equals the modulus (inc*x=modulus) and $(1/f_c)x$=period. In other words, the number of stairsteps is determined by the DTO modulus divided by the increment value inc. Thus, the period of the sawtooth waveform of FIG. 3 is equal to the number of stair steps times the period of clock $1/f_c$ as reflected by the equation below.

$$\text{period} = (\text{modulus/inc})(1/f_c) \tag{2}$$

Since 1/period of the sawtooth waveform generated by DTO 6 of FIG. 1 is equal to the frequency of DTO 6, $f_{DTO}$, then $f_{DTO}$ is determined by the following equation, where n is the number of bits in the DTO accumulator.

$$f_{DTO} = f_c/(\text{modulus/inc}) = (\text{inc}/2^n)*f_c \tag{3}$$

DTO 6 of FIG. 1 serves to convert the crystal frequency of oscillator 10 of FIG. 1 to a lower output frequency which when multiplied by a phase lock loop (2×PLL 22 of FIG. 1) becomes the pixel clock frequency $f_{pix}$, where $$f_{pix} = \text{PLL factor}*f_{DTO}. \tag{4}$$

The PLL factor is the multiplication factor of the PLL of block 22 in FIG. 1 which is shown as two.

The nominal pixel clock frequency $f_{pix}$ is also equal to the nominal number of pixels per line times the horizontal sync frequency $f_h$, where $$\text{nominal } f_{pix} = \text{nominal \# of pixels per line}*f_h \tag{5}$$

The DTO increment can be determined from the following equation which takes into account the PLL multiplication factor of 2. The increment, inc, of block 12 of DTO 6 in FIG. 1 can be calculated as follows:

$$\text{inc} = 2^n/\text{PLL factor}*f_{pix}/f_c \tag{6}$$

TABLE 1

| STD. | $F_h$(HZ) | Sampling Rate | Pixels Per Line | $f_{pix}$(MHz) | $f_c$(MHz) | increment Hexadecimal |
|---|---|---|---|---|---|---|
| NTSC | 15734.26 | square pixel | 780 | 12.27 | 26.8 | 3a9dbl |
| NTSC | 15734.26 | ITU R BT.601 | 858 | 13.5 | 24.576 | 465000 |
| PAL | 15625 | square pixel | 944 | 14.75 | 26.8 | 4672a0 |
| PAL | 15625 | ITU-R BT.601 | 864 | 13.5 | 24.576 | 465000 |
| MPAL | 15734.26 | square pixel | 780 | 12.27 | 26.8 | 3a9dbl |
| MPAL | 15734.26 | ITU-R BT.601 | 858 | 13.5 | 24.576 | 465000 |
| NPAL | 15625 | square pixel | 944 | 14.75 | 26.8 | 4672a0 |

TABLE 1-continued

| STD. | $F_h$(HZ) | Sampling Rate | Pixels Per Line | $f_{pix}$(MHz) | $f_c$(MHz) | increment Hexadecimal |
|---|---|---|---|---|---|---|
| NPAL | 15625 | ITU-R BT.601 | 864 | 13.5 | 24.576 | 465000 |

Table 1, above, lists the hexadecimal increment value for different TV standards and sampling rates where n=24 bits. The various standards shown above can easily be implemented according to the invention by changing the DTO nominal increment values, $f_{pix}$, and chroma trap coefficients. Although $f_{pix}$ changes involve a change of the crystal 8 of FIG. 1, the other parameters are easily changed in software for a microprocessor implemented system.

Referring back to FIG. 1, analog-to-digital converter 26 receives composite video information in connection with clocking an output to a notched filter 28 (an known as a chroma trap) for filtering chroma frequencies. Analog-to-digital conversion occurs at pixel clock frequency $f_{pix}$. Pixel counter 24 also counts at pixel clock frequency $f_{pix}$ in connection with being clocked by the pixel clock frequency generated by 2×PLL 22. For NTSC (National Television Standards Committee) systems the color burst signal frequency is around 3.58 MHz. This frequency range corresponds to the color-burst signal in the composite video. The color-burst signal is approximately nine cycles of the chrominance subcarrier added to the backporch of the horizontal sync pulse of the composite color signal and is used in a color receiver as a phase reference. More simply put, the color burst allows the color decoder to decode the color information contained in an active line of video. The color burst signal is filtered out so that it will not interfere with processing the horizontal sync signal in connection with incrementing DTO 6. The digital information from analog-to-digital converter 26 as filtered by chroma trap 28 is provided to the inputs of coarse phase detector 30 and fine phase detector 32. Coarse phase detector 30 detects the presence of the horizontal sync pulse in a signal by detecting a negative pulse of at least a predetermined minimum width. For instance, a horizontal sync pulse can be identified by pixel data received which is below a specified threshold for a predetermined number of clock cycles. In connection with the detection of the horizontal sync pulse, which is indicative of the end of a line of horizontal video pixels, the current value in pixel counter 24 is saved in a register accessed by microprocessor 2. Microprocessor 2 reads the saved pixel value and compares it against a nominal desired value. The nominal desired value is determined in connection with using a filter window for determining when phase lock is achieved. In an experimental model of the invention, windows lasting 15 clock pulses were used. Lock should be achieved by phase shifting the sync pulse so that its falling edge lines up with the center of the filter window. In a preferred embodiment of the invention, a detected falling edge which stays at a logic low level for at least 16 clock pulses defines a sync pulse. When the falling edge of horizontal sync occurs at the center of the phase detector window, the pixel count is 7. There are about 14 clock pulses worth of pipeline (miscellaneous system, e.g. propagation) delays. Consequently, the nominal desired pixel counter value includes the 16 clock pulses of a low logic level, the 7 clock pulses to the center of the filter window and the 14 clock pulses of pipeline delays. Thus, the nominal desired pixel counter value, which corresponds to the locked condition, is 37.

Figure 4:
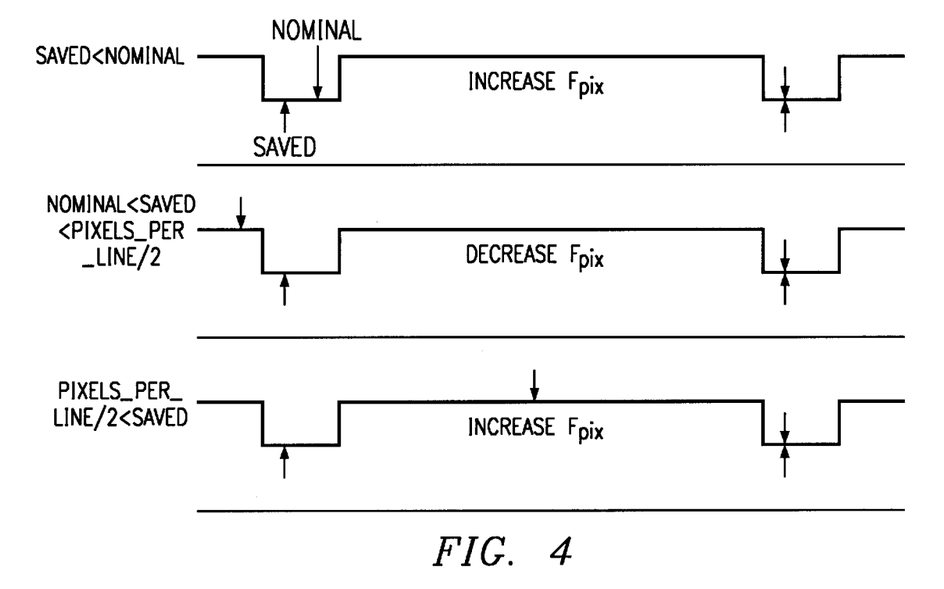
FIG. 4 illustrates graphs showing three aforementioned possible nominal value to saved value relationships with the nominal value represented by a down arrow and the saved value represented by an up arrow.

The output frequency of DTO 6 and the pixel clock frequency generated by 2×PLL 22 are adjusted in coarse increments to match the saved pixel counter value with the nominal desired value. The output frequency adjustments of DTO 6 are made in connection with phase detector 30 which produces an adjustment frequency proportional to the phase difference of the falling edge of the sync signal and the center of the filter window. If the saved pixel counter value is less than the nominal value then the phase detector produces an adjustment frequency which causes the output frequency of DTO 6, (and correspondingly the pixel clock frequency) to increase in order to run pixel counter 24 faster and achieve a match between the saved value and the desired nominal value. If the saved value is greater than the nominal value, then coarse phase detector 30 causes the pixel clock frequency (and correspondingly pixel counter 24 and the output frequency of DTO6) to decrease unless the saved value is greater than ½ the number of pixels per line of video, in which case the pixel clock frequency is increased (this choice resulting in the fastest possible path to the locked condition). FIG. 4 illustrates graphs showing the three aforementioned possibilities with the nominal value represented by a down arrow and the saved value represented by an up arrow. The locked result is represented by the meeting of two arrow heads. During the vertical sync interval, the serration and equalization pulses occur at twice the horizontal sync frequency. Once the coarse lock logic has detected a sync, it is not rearmed until a minimum of ¾ of the line time has elapsed so that detection of these half line pulses is avoided. This is a novel characteristic of the invention.

Figures 5, 9:
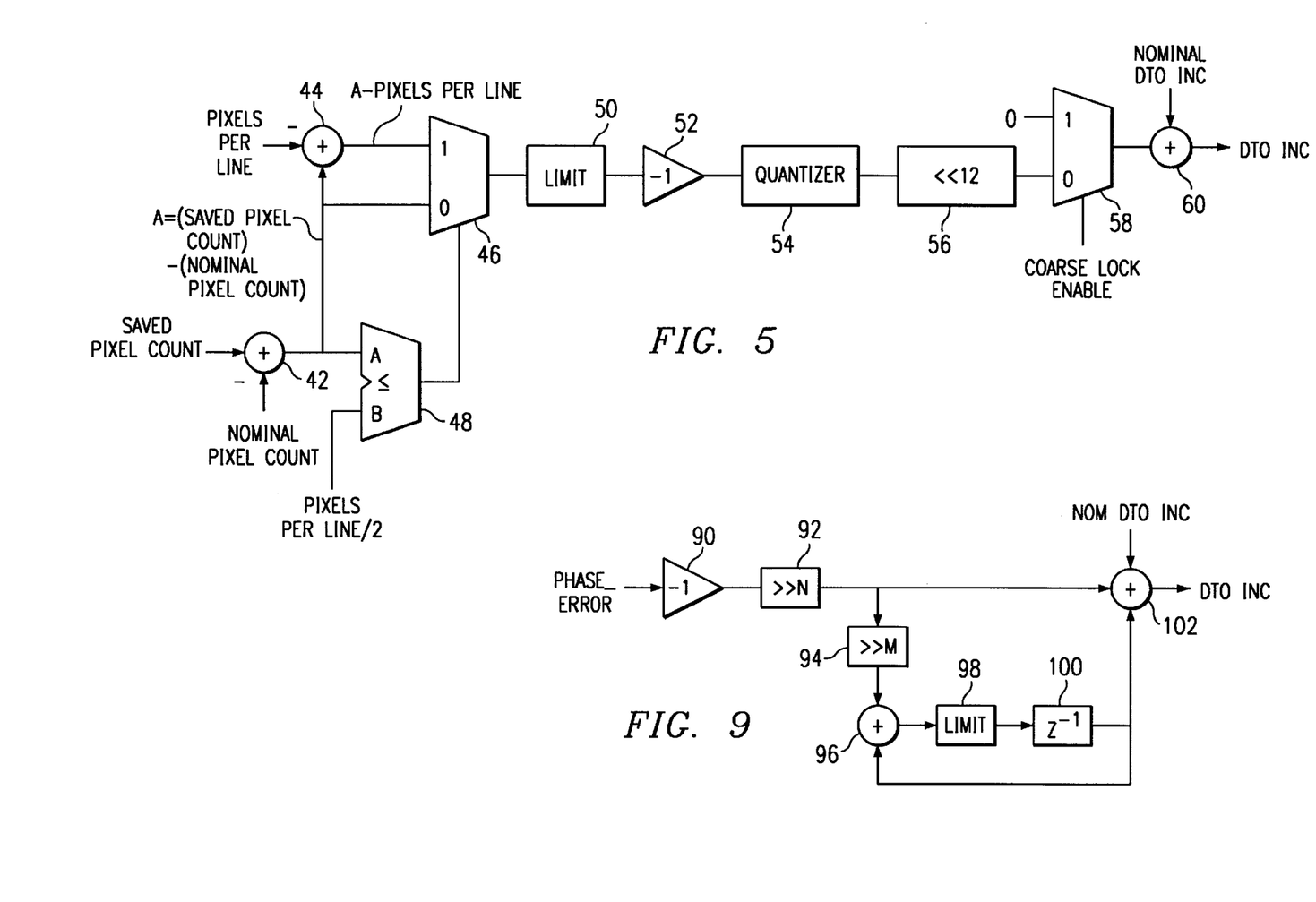
FIG. 5 illustrates a block diagram demonstrating the logic behind the coarse phase lock processing performed by the coarse phase detector of FIG. 1.
FIG. 9 is a logic diagram which illustrates the processing for the fine phase lock.

FIG. 5 illustrates a block diagram demonstrating the logic behind the coarse phase lock processing performed by coarse phase detector 30 of FIG. 1. The processing shown in FIG. 5 can be achieved in software. With reference to FIG. 5, adder 42 adds the saved pixel count to a negated nominal pixel count. Adder 44 adds the output of adder 42, which is equal to variable A (saved pixel count minus the nominal pixel count), to a negated number of pixels per line expected per the system chosen (e.g., for the standards as shown in table 1 where the pixels per line are listed in a column in the table.) Multiplexer 46 selects the output adder 42 or rather variable A or it selects the output of adder 44 which represents variable A minus the pixels per line. Comparator 48 controls this selection on the basis of whether variable A is greater than variable B which represents the number of pixels per line divided by 2. If variable A is greater than or equal to variable B then multiplexer 46 selects the input labeled (A-pixels per line) otherwise multiplexer 46 selects the input of variable A. Multiplexer selections of variable A minus pixels per line and variable A, which represent delta correction numbers, are limited by limit block 50 to a value of ±31 so that the coarse correction to the horizontal DTO frequency does not stress the hardware. This limited delta correction is negated by inverter 52 and quantized by quantizer 54 to certain values (e.g. −31, −16, −8, −4, −2, −1, 0, 1, 2, 4, 8, 16, 31, etc.). The quantized result is left shifted by shift register 56 by a predetermined number of bits to produce a value that is added to the nominal DTO increment. For example, for the embodiment shown in FIG. 5, the quantized result is shifted by 12 bits. If no sync pulse is detected, the coarse lock enable bit which is read by the microprocessor and controls multiplexer 58 is logic one and multiplexer 58 selects 0 as the input number to which the nominal DTO increment (inc) is added by adder 60 to serve as the DTO increment which is written by microprocessor 2 of FIG. 1 to increment block 12 of DTO 6 of FIG. 1. Therefore, the nominal DTO increment value as described in equation (6) is written to DTO 6 of FIG. 1. If a sync pulse is detected, then the coarse lock enable bit to multiplexer 58 is logic zero and the processed saved pixel count from shift register 56 is selected by multiplexer 58 and added by adder 60 to the nominal DTO increment (inc). The sum from adder 60 is written by microprocessor 2 of FIG. 1 to increment block 12 of DTO 6 of FIG. 1 and this serves as the DTO coarse adjustment increment.

The consequence of establishing a coarse lock results in positioning the falling edge of the horizontal sync pulse within a 15 pixel clock wide gate window established in fine phase detector 32 of FIG. 1. The fine lock operation of fine phase detector 32 centers the edge of the horizontal sync pulse within the gate window with sub-pixel accuracy. This gate window is opened once per line and serves to avoid detection of false pulses such as those which occur during the vertical sync interval. The switch from coarse to fine lock is enabled when the absolute value of the flat window phase error falls below a predetermined threshold value.

Figure 6A:
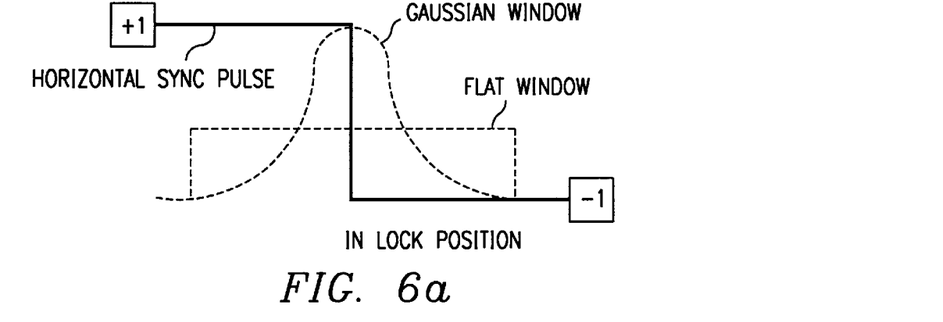
FIGS. 6a, 6b and 6c illustrate three graphs showing a gaussian window, and a flat window relative to a horizontal sync pulse, where the respective graphs are shown in locked position, with negative phase error (indicating the necessity for an increase in $f_{pix}$) and with positive phase error (indicating the necessity for a decrease in $f_{pix}$).
Figure 6B:
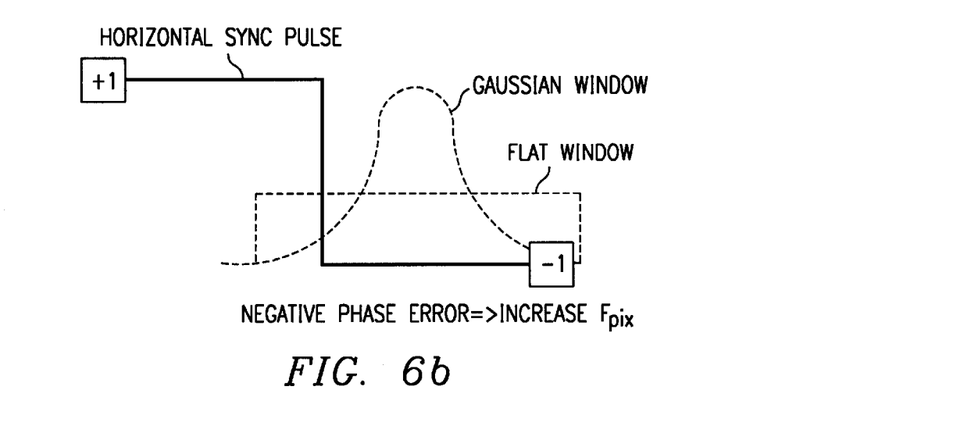
Figure 6C:
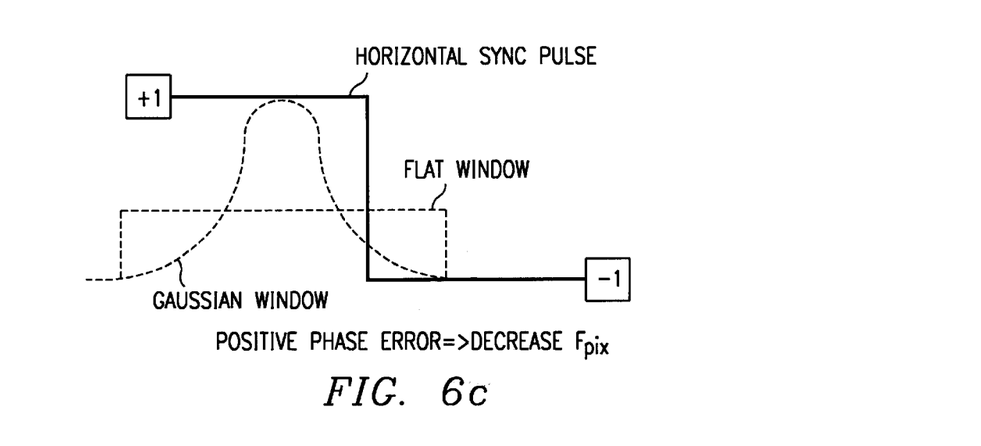

FIGS. 6a, 6b and 6c illustrate three graphs showing a gaussian window (the distribution within the window resembles a guassian weight distribution), and a flat window (the weight distribution with in the window is rectangular) relative to a horizontal sync pulse, where the respective graphs are shown in locked position, with negative phase error (indicating the necessity for an increase in $f_{pix}$) and with positive phase error (indicating the necessity for a decrease in $f_{pix}$). The sync pulse is normalized to fall between values of +1 and −1. Assuming multiplication by the windows of pixel information corresponding to the horizontal sync pulse, the flat window applies an equal weighting to the pixels while the gaussian applies heavier weights to the pixels multiplied by the gaussian waveform at points near the center of the waveform. The windows are enabled by the decode of pixel counter 24 which is clocked by pixel clock PCK of FIG. 1. If the sync edge falls to the left of the window, as shown in the FIG. 6b, then the pixel clock frequency must be increased in order to center the window on the sync edge to lock position as is shown in FIG. 6a. If the sync edge falls to the right, as shown in FIG. 6c, then the pixel clock frequency must be decreased to achieve lock.

Figure 7:
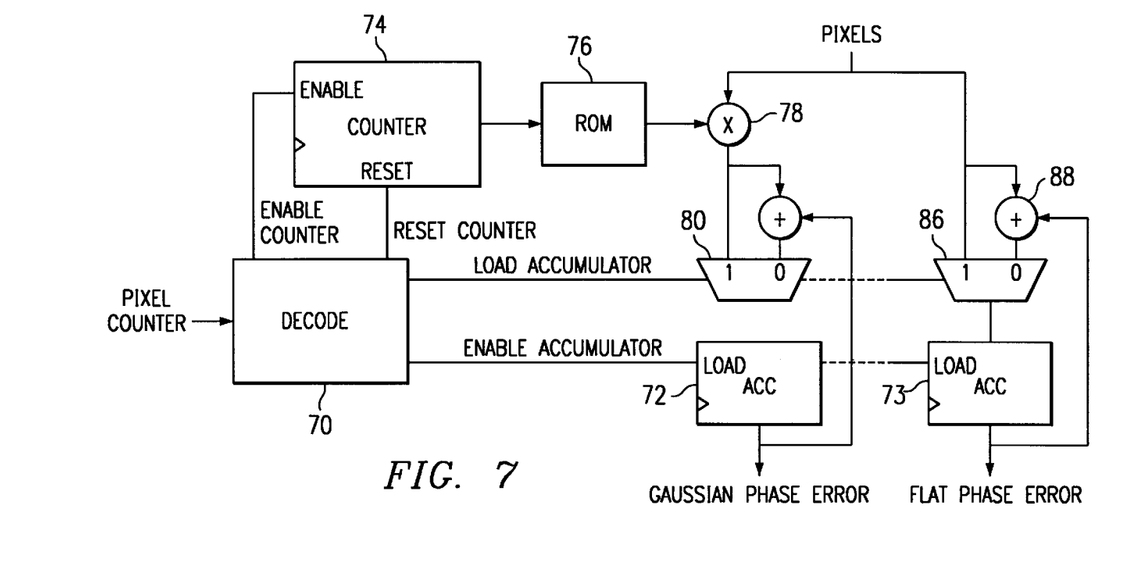
FIG. 7 is a block/logic diagram showing the architecture for the fine phase detector block of FIG. 1.

The architecture for fine phase detector block 32 of FIG. 1 is shown in the block/logic diagram of FIG. 7. Pixel decode logic block 70 generates signals based on the pixel counter which enables accumulator 72 and accumulator 73. In addition, an enable counter signal enables counter 74 which causes Read Only Memory (ROM) 76 to generate gaussian coefficient weights from a ROM lookup table. Multiplier 78 multiplies the gaussian coefficient weights by incoming digital pixel values. The output of multiplier 78 is sent to multiplexer 80 and summer 82. Multiplexer 80 selects either the product of the gaussian coefficient and an incoming pixel value, or the sum of the current output of accumulator 72 and the product of the gaussian coefficient and an incoming pixel value. The output of accumulator 72 represents the gaussian phase error between the center of a 15 pixel clock gaussian window and the horizontal sync pulse. The decode logic in decode block 70 generates signals based on the pixel counter which enable arithmetic logic within block 70 to cause accumulator 72 to accumulate gaussian phase error outputs through a feedback loop to summer 82. When the gaussian window is opened at count zero in an indexed count from zero to 14 (the duration of the gaussian window), the load accumulator line input to multiplexer 80, which controls multiplexer 80, goes high. At this time, the output of multiplexer 80 is loaded into accumulator 80. This loaded input serves as an initial value of the accumulator. The load accumulator line returns to logic low after indexed count 0. A flat phase error window of 15 pixel clocks wide is also opened at indexed count zero in the zero to 14 indexed count. The load accumulator line is also input to and controls multiplexer 86. When the load accumulator line goes high in connection with the gaussian window being opened, the flat window is also opened and the outputs from multiplexers 80 and 86 are loaded into their respective accumulators 72 and 73. The enable accumulator line which controls the loading of accumulator 72 and accumulator 73, goes to logic high at indexed count zero and it stays at logic high through indexed count 14. Multiplexer 86 selects either the indexed pixel values to be loaded into accumulator 73 or the sum of the indexed pixel value and the current accumulated indexed pixel values. The previous indexed pixel values are summed by summer 88 in connection with a feedback loop from the output of accumulator 73 and summer 88. The output of accumulator 73 represents the flat phase error.

The gaussian phase error is the accumulation of weighted values (the sum of the products of gaussian weight coefficients and the indexed pixel values). The flat phase error is the accumulation of the indexed pixels since all have the same weight. Microprocessor 2 of FIG. 1 reads the phase error outputs on every line. The phase error values must be normalized to fall between positive and negative limits. The normalized flat phase error is computed as shown below in equation (7) where the mid pixel value is equal to half the value of the sum of the horizontal sync back porch (the area of the video waveform between the rising edge of the horizontal sync and right before the active video) and the horizontal sync tip (the sync level). Typically, for an 8 bit analog-to-digital converter, there are $2^8=256$ levels corresponding to the range 0 . . . 255. The sync back porch lies at the 64th level while the sync tip lies at the zero level. Consequently, the mid pixel value (mid pix) is (64+0)/2=32, or the 32nd level.

flat phase error=$\Sigma(pix_i$−mid pix), i=0, . . . 14=$\Sigma pix_i$−15*mid pix(7)

The normalized gaussian phase error requires the subtraction of a similar normalization constant from the hardware output as shown below in equation (8).

gaussian phase error=$\Sigma[coef_i*(pix_i$−mid pix)], i=0, . . . 14=$\Sigma(coef_i*pix_i$)−mid pix*$\Sigma(coef_i)$ (8)

A programmable normalization constant enables the effective processing of weak and noisy signals. For instance, when a weak input signal is present which is noisy, this condition can be detected by microprocessor 2 of FIG. 1. When the sum of the detected sync (corresponding to a coarse lock enable being equal to zero) over a frame falls below a threshold value, the weak signal condition can be detected. Since the normal horizontal sync pulse corresponds to a pixel value of zero at the analog-to-digital converter output, the presence of noise raises the sync tip to a higher level. The mid point pixel (mid pix) also increases to a higher level. A factor of 1.5 is applied to the mid pix value to generate a normalization constant for this condition. Thus, a mid pix value of 32 under normal conditions, becomes 48 under the weak signal condition.

Figure 8:
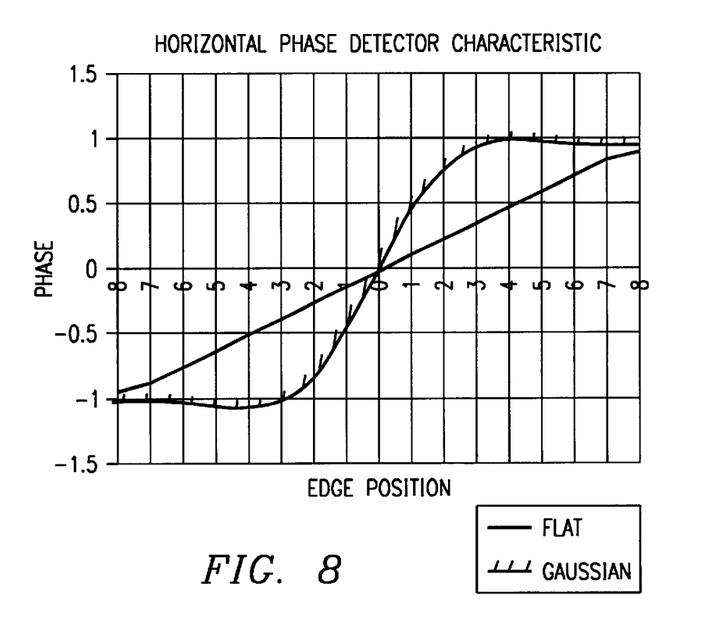
FIG. 8 is a graph illustrating phase error versus sync falling edge position for the gaussian and flat windows.
Figure 8A:
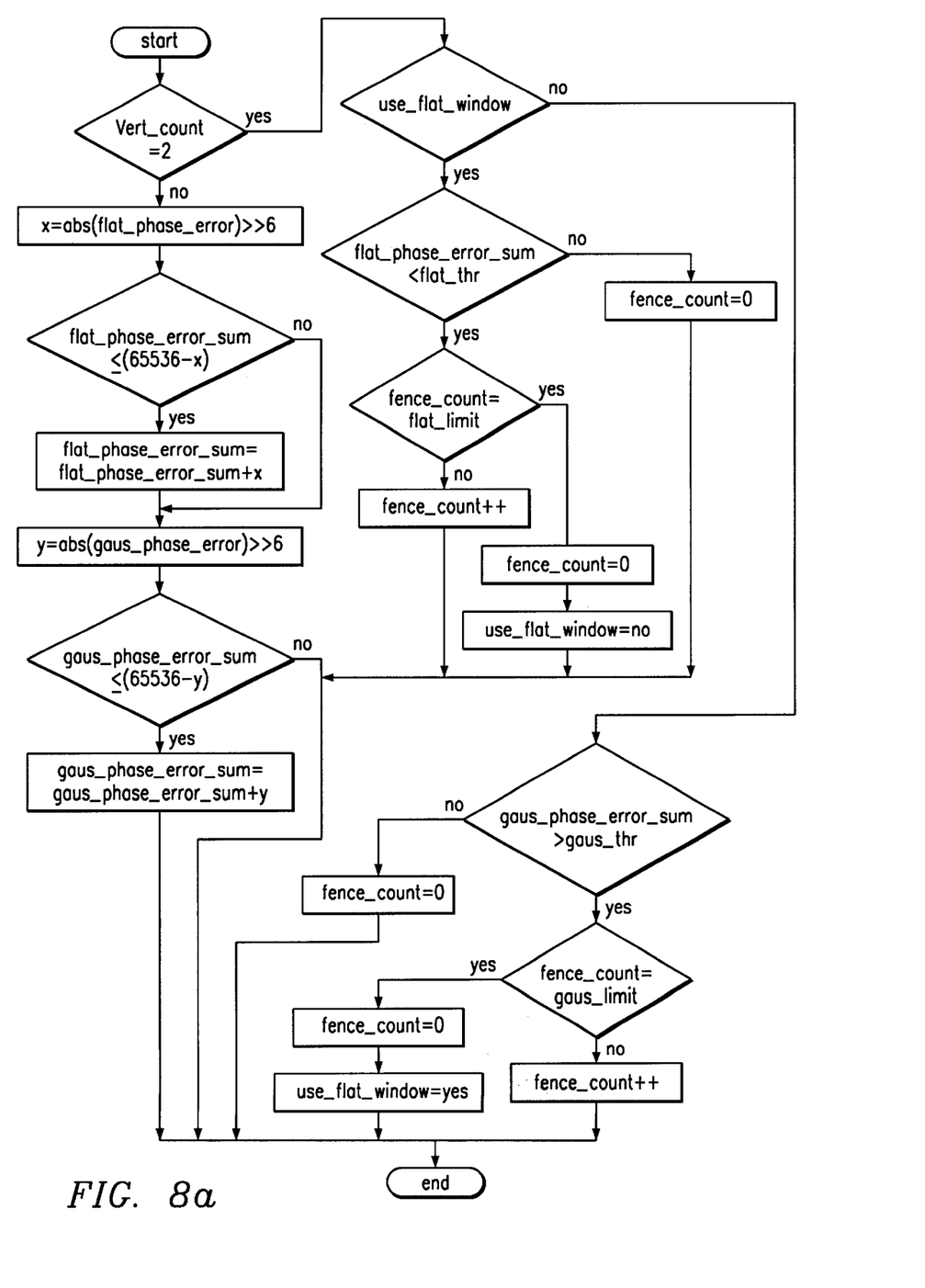
FIG. 8a illustrates a flow chart showing the steps occurring with respect to the gaussian window error and flat window processing.

FIG. 8 is a graph illustrating phase error versus sync falling edge position for the gaussian and flat windows. As shown, the width of the windows measure 15 pixels wide ±7 pixels each from the center of the window at 0. The gaussian window is narrower than the flat window and it has a higher gain within 3 pixels of the center window position. The flat window has a constant gain over the entire 15 pixel width. The gaussian window is used for fine lock to a standard video signal such as reception of television stations while the flat window is used for a non-standard video signal whose horizontal sync is not very stable such as the VCR and video games. The choice of window is determined by comparing the sum of the absolute value of the flat window phase error over a frame (525 video lines per frame) against a threshold. Since each window may have a different lock position, the window selection process includes some hysteresis and a fence to prevent oscillation between the two windows. If the flat phase error sum is less than a threshold ($THR_{flat}$) for a predetermined number of consecutive frames, this predetermined number being defined as the "fence count" (e.g. 16), then the gaussian window is selected by comparator 93. If the gaussian phase error sum is greater than a threshold ($THR_{gaussian}$) for a predetermined number of consecutive frames (e.g. 2), then the flat window is selected by comparator 95. In an experimental software implementation of the invention, 16 bit registers were used to store phase error results. In order to prevent over flow, the register results were right shifted by six bits which has the effect of scaling the phase error results by $\frac{1}{2}^6$ or $\frac{1}{64}$th. In its preferred embodiment, the invention is implemented using software particularly when used in a microprocessor-based system. FIG. 8a illustrates a flow chart showing the steps occurring with respect to the gaussian window error and flat window processing.

FIG. 9 is a logic diagram which illustrates the processing for the fine phase lock. The phase error is inverted by inverter 90 and right shifted n bits, where n is an integer, by shift register 92. The phase detector window selected determines n. The result from shift register 92 is then shifted right m bits by shift register 94 (m being an integer) and then accumulated, by summing the result with summer 96, using a line delayed feed back loop which limits the summed result between positive and negative limits (so that overflow does not occur) by virtue of limit block 98 and delay line block 100. The shift constants m and n are chosen to achieve desired phase-locked loop time constants and damping factors for TV (television) and VCR (video cassette recorder) modes of operation. These shift constants can easily be changed in software, particularly with a microprocessor-based system. The output from block 100 represents an accumulated offset characterized as a constant frequency error in the horizontal sync frequency that may occur in non-standard video. Summer 102 adds this accumulated offset with the output of shift register 92 and the nominal DTO increment (nom DTO inc) to produce an actual DTO increment (DTO inc) which is written to increment block 12 of FIG. 1.

Figure 10:
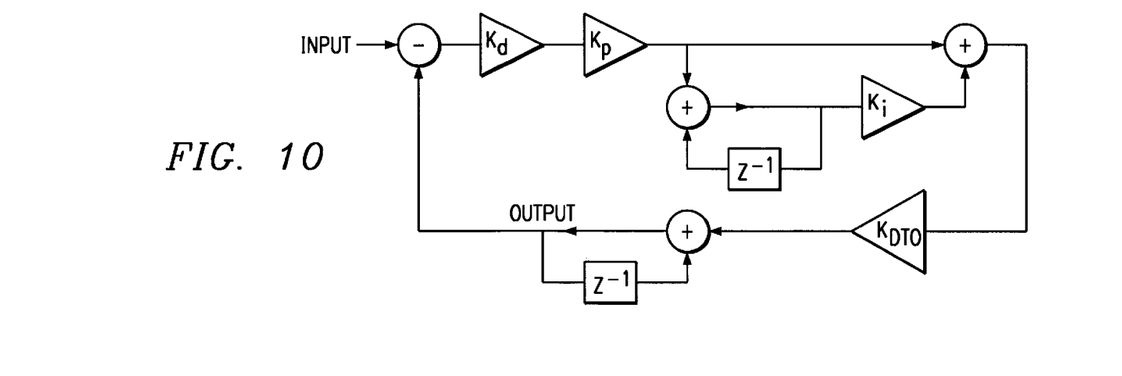
FIG. 10 is a simplified block/logic diagram of the horizontal phase logic loop.

FIG. 10 illustrates a simplified block/logic diagram of the invention's horizontal phase logic loop. A phase value is input and there are two accumulator blocks labeled $z^{-1}$ and four gain blocks, $K_d$, $K_p$, $K_i$, and $K_{DTO}$. $K_d$ is the phase detector gain in units of least significant bits (LSBs) per pixel. $K_p=\frac{1}{2}^n$ is a proportional gain applied to the phase error. $K_i=\frac{1}{2}^m$ is an integral gain applied to the phase error accumulator. $K_{DTO}$ is the DTO gain in units of pixels per LSB. $K_{DTO}$ is computed as the phase shift in pixels generated by one LSB change in the DTO increment as indicated by formula (9) below.

$$K_{DTO}=\text{pixels per line}*[1/(1+1/\text{nominal inc})-1] \tag{9}$$

The response of the invention's horizontal phase locked loop to a step change in input for the flat and gaussian phase detectors can be characterized as follows. The flat window has a relatively small time constant and a large damping factor which enables fast response to head switching transients in the VCR mode. The gaussian window has a large time constant and smaller damping factor which enables a slow response to a TV signal which may have a smaller signal to noise ratio.

The foregoing described phase-locked loop can be implemented on an integrated circuit and used as part of a video decoder chip.

Although the invention has been described in detail herein with reference to its preferred embodiment, it is to be understood that this description is by way of example only, and is not to be construed in a limiting sense. It is to be further understood that numerous changes in the details of the embodiments of the invention and additional embodiments of the invention, will be apparent to, and may be made by persons of ordinary skill in the art having reference to this description. It is contemplated that all such changes and additional embodiments are within the true scope and spirit of the invention as claimed below.

We claim:

1. A method of achieving lock in a phase-locked loop comprising
   counting pixels of digital video data, testing for the occurrence of a sync pulse in said digital data and in connection with detecting a sync pulse, performing the following steps:
   storing said pixel count value in a register;
   comparing the saved pixel count value with a nominal pixel count value;
   adjusting, by a coarse amount, an increment value to a discrete time oscillator in connection with said comparison of said saved pixel count value with said nominal pixel count value; and
   further adjusting by a fine amount, said increment value in connection with a phase error by adjusting the falling edge of said sync pulse so as to be substantially centered within a filter gate window of a width corresponding to a predetermined number of pixel clock cycles.

2. A method of achieving lock in a phase-locked loop as recited in claim 1 wherein the detecting a sync pulse is accomplished by identifying a predetermined number of pixels which are below a threshold value.

3. A method of achieving lock in a phase-locked looped as recited in claim 1 wherein said window consists of a flat window or a gaussian window.

4. A method as recited in claim 2 wherein said predetermined number of pixels is 16.

5. A method of achieving lock in a phase-locked loop comprising
   counting pixels of digital video data, testing for the occurrence of a sync pulse in said digital data and in connection with detecting a sync pulse, performing the following steps:

storing said pixel count value in a register;

comparing the saved pixel count value with a nominal pixel count value;

adjusting, by a coarse amount, an increment value to a discrete time oscillator in connection with said comparison of said saved pixel count value with said nominal pixel count value; and further adjusting by a fine amount, said increment value in connection with a phase error, whose computation is based on a window weighting function applied to the sync pixels; and writing a nominal increment value to said discrete time oscillator in connection with the non-detection of said sync pulse wherein the step of adjusting said increment value by a coarse amount is accomplished by the following steps:

determining whether said sync pulse has been detected;

writing a nominal increment value to said discrete time oscillator in connection with the non-detection of said sync pulse; and determining an increment value within a range of values.

6. A method of achieving lock in a phase-locked loop as recited in claim 5 wherein said range of values is between +31 and −31.

7. A method of achieving lock in a phase-locked loop as recited in claim 5 wherein said range of values are quantized to certain selected values.

8. A phase-locked loop comprising:

a microprocessor;

an asynchronous interface coupled to said microprocessor;

a discrete time oscillator couple to said asynchronous interface;

a sine ROM connected to said discrete time oscillator;

a digital-to-analog converter connected to said sine ROM;

an analog phase-locked loop connected to said digital-to-analog converter, said analog phase-locked loop being operable to output a pixel clock;

an analog-to-digital converter connected to said analog phase-locked loop, said analog-to digital converter being operable to receive composite video clocked according to said pixel clock;

a pixel counter, said pixel counter in operation being clocked by said pixel clock;

a chroma trap connected to said analog-to-digital converter; and a coarse phase detector and a fine phase detector connected to said chroma trap and said microprocessor.

9. A phase-locked loop as recited in claim 8 wherein said analog phase-locked loop is of a phase-frequency variety.

10. A phase-locked loop as recited in claim 8 which further includes an oscillator connected to said digital-to-analog converter.

11. A video decoder which includes the phase-locked loop recited in claim 8.

12. A video decoder as recited in claim 11 wherein said phase-locked loop is operable to lock said pixel clock to an incoming horizontal sync pulse of composite video.

* * * * *